(12) United States Patent
Nakamura et al.

(10) Patent No.: US 7,332,365 B2
(45) Date of Patent: Feb. 19, 2008

(54) METHOD FOR FABRICATING GROUP-III NITRIDE DEVICES AND DEVICES FABRICATED USING METHOD

(75) Inventors: Shuji Nakamura, Santa Barbara, CA (US); Steven DenBaars, Goleta, CA (US); John Edmond, Durham, NC (US); Chuck Swoboda, Durham, NC (US); Umesh Mishra, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 426 days.

(21) Appl. No.: 10/848,937

(22) Filed: May 18, 2004

(65) Prior Publication Data

US 2006/0049411 A1 Mar. 9, 2006

(51) Int. Cl.
*H01L 21/00* (2006.01)
*H01L 33/00* (2006.01)

(52) U.S. Cl. .................. 438/29; 438/46; 257/94; 257/98

(58) Field of Classification Search ............... 438/22, 438/29, 39, 40, 41, 44, 46, 47; 257/79, 86, 257/94, 98
See application file for complete search history.

(56) References Cited

U.S. PATENT DOCUMENTS

| | | | |
|---|---|---|---|
| 4,865,685 A | 9/1989 | Palmour | 156/643 |
| 4,902,356 A | 2/1990 | Noguchi et al. | 148/33.4 |
| 4,912,532 A | 3/1990 | Cook et al. | 357/16 |
| 5,103,271 A | 4/1992 | Izumiya et al. | 357/17 |
| 5,376,580 A | 12/1994 | Kish et al. | 437/127 |
| 5,502,316 A | 3/1996 | Kish et al. | 257/94 |
| 5,679,152 A | 10/1997 | Tischler et al. | 117/97 |
| 5,985,687 A | 11/1999 | Bowers et al. | 438/46 |

(Continued)

FOREIGN PATENT DOCUMENTS

EP 0616376 A 9/1994

(Continued)

OTHER PUBLICATIONS

M.K. Kelly et al., "Optical Process for Liftoff of Group III-Nitride Films", Rapid Research Note, Technische Universität Münche, Garching, Germany, (Nov. 28, 1996) pp. 1-2.

(Continued)

*Primary Examiner*—Kevin M. Picardat
(74) *Attorney, Agent, or Firm*—Koppel, Patrick, Heybl & Dawson

(57) ABSTRACT

A method according to the present invention for fabricating high light extraction photonic devices comprising growing an epitaxial semiconductor structure on a substrate and depositing a first mirror layer on the epitaxial semiconductor structure such that the epitaxial semiconductor structure is sandwiched between the first mirror layer and the substrate. Flip-chip mounting the epitaxial semiconductor structure, with its first mirror and substrate on a submount such that the epitaxial semiconductor device structure is sandwiched between the submount and substrate. The substrate is then removed from the epitaxial structure by introducing an etch environment to the substrate. A second mirror layer is deposited on the epitaxial semiconductor structure such that the epitaxial semiconductor structure is sandwiched between the first and second mirror layers. A device according to the present invention comprising a resonant cavity light emitting diode (RCLED) mounted to a submount.

47 Claims, 7 Drawing Sheets

U.S. PATENT DOCUMENTS

| | | | |
|---|---|---|---|
| 6,071,795 A | 6/2000 | Cheung et al. | 438/458 |
| 6,258,699 B1 | 7/2001 | Chang et al. | 438/458 |
| 6,303,405 B1 | 10/2001 | Yoshida et al. | 438/46 |
| 6,365,429 B1 | 4/2002 | Kneissl et al. | 438/46 |
| 6,420,199 B1 | 7/2002 | Coman et al. | 438/22 |
| 6,420,242 B1 | 7/2002 | Cheung et al. | 438/458 |
| 6,448,102 B1 | 9/2002 | Kneissl et al. | 438/46 |
| 6,465,809 B1 | 10/2002 | Furukawa et al. | 257/94 |
| 6,468,824 B2 | 10/2002 | Chen et al. | 438/46 |
| 6,475,889 B1 | 11/2002 | Ring | 438/571 |
| 6,559,075 B1 | 5/2003 | Kelly et al. | 438/795 |
| 6,562,648 B1 | 5/2003 | Wong et al. | 438/46 |
| 6,607,931 B2 | 8/2003 | Streubel | 438/22 |
| 6,653,163 B2 * | 11/2003 | Van Hoof et al. | 438/47 |
| 6,677,173 B2 | 1/2004 | Ota | 438/22 |
| 6,680,495 B2 * | 1/2004 | Fitzergald | 438/48 |
| 6,716,654 B2 | 4/2004 | Hsu et al. | 438/22 |
| 6,740,604 B2 | 5/2004 | Kelly et al. | 438/795 |
| 6,757,314 B2 | 6/2004 | Kneissl et al. | 372/50 |
| 6,786,390 B2 | 9/2004 | Yang et al. | 228/179.1 |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,846,686 B2 | 1/2005 | Saeki et al. | 438/22 |
| 6,847,057 B1 * | 1/2005 | Gardner et al. | 257/99 |
| 6,849,878 B2 | 2/2005 | Bader et al. | 257/103 |
| 7,115,908 B2 * | 10/2006 | Watanabe et al. | 257/79 |
| 2002/0000559 A1 | 1/2002 | Hoof et al. | |
| 2002/0068396 A1 | 6/2002 | Fitzergald | |
| 2003/0173602 A1 | 9/2003 | Hsu et al. | |
| 2004/0072382 A1 | 4/2004 | Kelly et al. | |
| 2005/0035354 A1 * | 2/2005 | Lin et al. | 257/79 |
| 2005/0247950 A1 * | 11/2005 | Nakamura et al. | 438/26 |

FOREIGN PATENT DOCUMENTS

| | | |
|---|---|---|
| EP | 0795941 A | 9/1997 |
| JP | 61059886 | 3/1986 |
| JP | 11238913 | 8/1999 |

OTHER PUBLICATIONS

E. F. Schubert et al., "Resonant Cavity Light-Emitting Diode", AT&T Bell Laboratories, Murray Hill, New Jersey, (1991) pp. 921-923.

E.F. Schubert, *Light Emitting Diodes*, Cambridge University Press, (2003) pp. 198-211.

* cited by examiner

METHOD FOR FABRICATING GROUP-III NITRIDE DEVICES AND DEVICES FABRICATED USING METHOD

BACKGROUND OF THE INVENTION

1. Field of the Invention

This invention relates to a method for fabricating a semiconductor device, and more particularly to a method for fabricating thin film semiconductor devices wherein the growth substrate is removed by a reactive ion etch.

2. Description of the Related Art

Improvements in the manufacturing of semiconductor materials in the Group-III nitride material system has focused interest on the development of GaN/AlGaN opto-electronic devices such as high efficiency blue, green and ultra-violet (UV) light emitting diodes (LED or LEDs) and lasers, and electronic devices such as high power microwave transistors. Some of the advantages of GaN is its 3.4 eV wide direct bandgap, high electron velocity ($2 \times 10^7$ cm/s), high breakdown field ($2 \times 10^6$ V/cm) and the availability of heterostructures.

Typical LEDs can comprise an active region sandwiched between a p-type doped layer and an n-type doped layer such that when a bias is applied across the doped layer electrons and holes are injected into the active region. The electrons and holes recombine in the active region to generate light omnidirectionally in an "emission sphere" with light radiating in all directions within the material that makes up the LED structure. Typical LEDs are efficient at generating light from the active region, but the light has difficulties emitting from the LED to the surroundings because of the differences in the indexes of refraction between the LED material and surroundings. In an LED having layers and regions of a typical thickness, only the photons formed in a cone about 20° wide in the direction of a surface exit the structure. The remainder of the light is trapped within the structure of the LED, and will eventually become absorbed into the semiconductor material. The light that is absorbed back into the LED material is lost to light generation, which reduces the overall emitting efficiency of the LED.

Different methods have been developed for improving the light emitting efficiency of typical LEDs, some of which include using non-planar shaped LEDs and roughening the emission surface of an LED. Both of these approaches improve emitting efficiency by providing an LED surface that has different angles such that when light from the LED's active region reaches the surface with varying angles between the light and the surface. This increases the possibility that the light will be within the 20° cone when it reaches the surface such that it emits from the LED. If it is not within the 20° angle, the light is reflected at different angles, increasing the likelihood that the light will be within the cone the next time it reaches the surface.

Emission efficiency is also enhanced by utilizing a resonant cavity structure in a resonant cavity LED (RCLED). RCLEDs are generally described in E. Fred Shubert, *Light Emitting Diodes*, Cambridge University Press, Pages 198-211 (2003), and typically comprise two oppositely doped epitaxial layers and mirrors on the oppositely doped layers such that the oppositely doped layers are sandwiched between the mirrors. One of the mirrors has reflectivity that is lower than the reflectivity of the other mirror so that light exits the RCLED through the lower reflectivity mirror. In other embodiments, an epitaxial active region can be included between the oppositely doped layers.

RCLEDs typically comprise epitaxial layers that are much thinner than standard LEDs and a resonant cavity effect appears when the thickness of the epitaxial layers is approximately one wavelength of the light generated by the epitaxial layers. The light generated in the resonant cavity forms a standing wave such that all light emitted is emitted directionally. This directional light emission releases the photons in directions that are substantially normal to a plane formed by the diode junction.

This structure allows RCLEDs to emit light intensity along the axis of the cavity (i.e. normal to the semiconductor surface) that is higher compared to conventional LEDs. The emission spectrum of RCLEDs has a higher spectral purity compared to conventional LEDs and the emission far-field pattern of RCLEDs is more directed compared to standard LEDs.

When fabricating RCLEDs of certain material systems there are challenges in depositing the two mirrors on opposite sides of epitaxial layers. The oppositely doped layers (and active region) are typically formed on a substrate using known fabrication methods and devices, such as epitaxial growth in a metalorganic chemical vapor deposition (MOCVD) reactor. Once these layers have been deposited on the substrate the first of the two mirrors may be deposited on the top, most recently grown epitaxial surface, which is usually the p-type doped layer. Placing a mirror surface on the surface of the other doped, first grown layer is not so easy, because the surface is in contact with the growth surface of the substrate. The layers of RCLEDs are typically thin so it can be difficult to separate the substrate from the epitaxial layers so that the second mirror can be deposited. It may not be practical to deposit the mirror on the substrate and then grow the epitaxial layer because of the crystal lattice mismatch between the mirror material and epitaxial layers.

One of the ways to deposit the second mirror on the epitaxial layers is to first remove the substrate. One technique for removing the substrate from epitaxial layers is described in U.S. Pat. No. 6,071,795 to W. Cheung et al. Thin films of GaN are epitaxially grown on a sapphire substrate and the substrate is then laser irradiated with a scanned beam at a wavelength at which sapphire is transparent but the GaN is absorbing (e.g. 248 mn wavelength). The intensity of the radiation, however, is low enough not to cause the irradiated area to separate. The separation process is performed after completion of the laser irradiation, such as by heating the structure to above the melting point of gallium. Another embodiment of the invention is described as growing a sacrificial material between the desired film and the growth substrate. The optical beam can then irradiate from the side of either the growth or acceptor substrate that is transparent to the optical beam.

The difficulty with this approach is that it is particularly adapted to semiconductor devices grown on sapphire substrates. Group-III nitride devices are often grown on silicon carbide substrates and if the wavelength of the irradiating optical beam is high enough not to be absorbed by the silicon carbide, the wavelength can be too high to be absorbed by the GaN. One alternative to this is to find a wavelength of light that is transparent to silicon carbide that will excite GaN. The difference in bandgap between GaN and silicon carbide, however, is too narrow to allow reliable transmission through the silicon carbide while being absorbed by the GaN.

SUMMARY OF THE INVENTION

One embodiment of a method for fabricating high light extraction photonic devices according to the present invention comprises growing an epitaxial semiconductor device structure on a substrate with the epitaxial semiconductor structure and substrate comprising an emitter adapted to emit light in response to a bias. Flip-chip mounting the epitaxial semiconductor structure and substrate on a submount such that the epitaxial semiconductor device structure is sandwiched between the submount and substrate. Etching the substrate off the epitaxial semiconductor device by utilizing an etch environment that etches the substrate is substantially faster than the epitaxial semiconductor structure.

A method for fabricating high light extraction photonic devices according to the present invention comprises growing an epitaxial semiconductor structure on a substrate and depositing a first mirror layer on the epitaxial semiconductor structure such that the epitaxial semiconductor structure is sandwiched between the first mirror layer and the substrate. The substrate is then removed from the epitaxial structure by introducing an etch environment to the substrate and a second mirror layer is deposited on the epitaxial semiconductor structure such that the epitaxial semiconductor structure is sandwiched between the first and second mirror layers.

One embodiment of a RCLED according to the present invention comprises a thin film epitaxial semiconductor structure and a first mirror layer on one surface of the epitaxial semiconductor structure. A second mirror layer is included on another surface of said epitaxial semiconductor structure such that said epitaxial semiconductor structure is sandwiched between the first and second mirrors, the second mirror layer being less reflective than the first mirror layer. A submount is also included, said epitaxial semiconductor structure with its first and second mirrors mounted on the submount, the first mirror layer being adjacent to the submount and the second mirror layer being the primary emitting surface.

A method for removing a silicon carbide substrate from a Group-III nitride epitaxial semiconductor material, comprising growing a Group-III nitride epitaxial semiconductor material on a silicon carbide substrate. An etch environment is introduced to the silicon carbide substrate, the etch environment etching silicon carbide faster than the Group-III nitride epitaxial material such that the etching substantially stops after the silicon carbide is etched off.

These and other features and advantages of the invention will be apparent to those skilled in the art from the following detailed description, taken together with the accompanying drawings, in which:

DETAILED DESCRIPTION OF THE INVENTION

Figure 1:
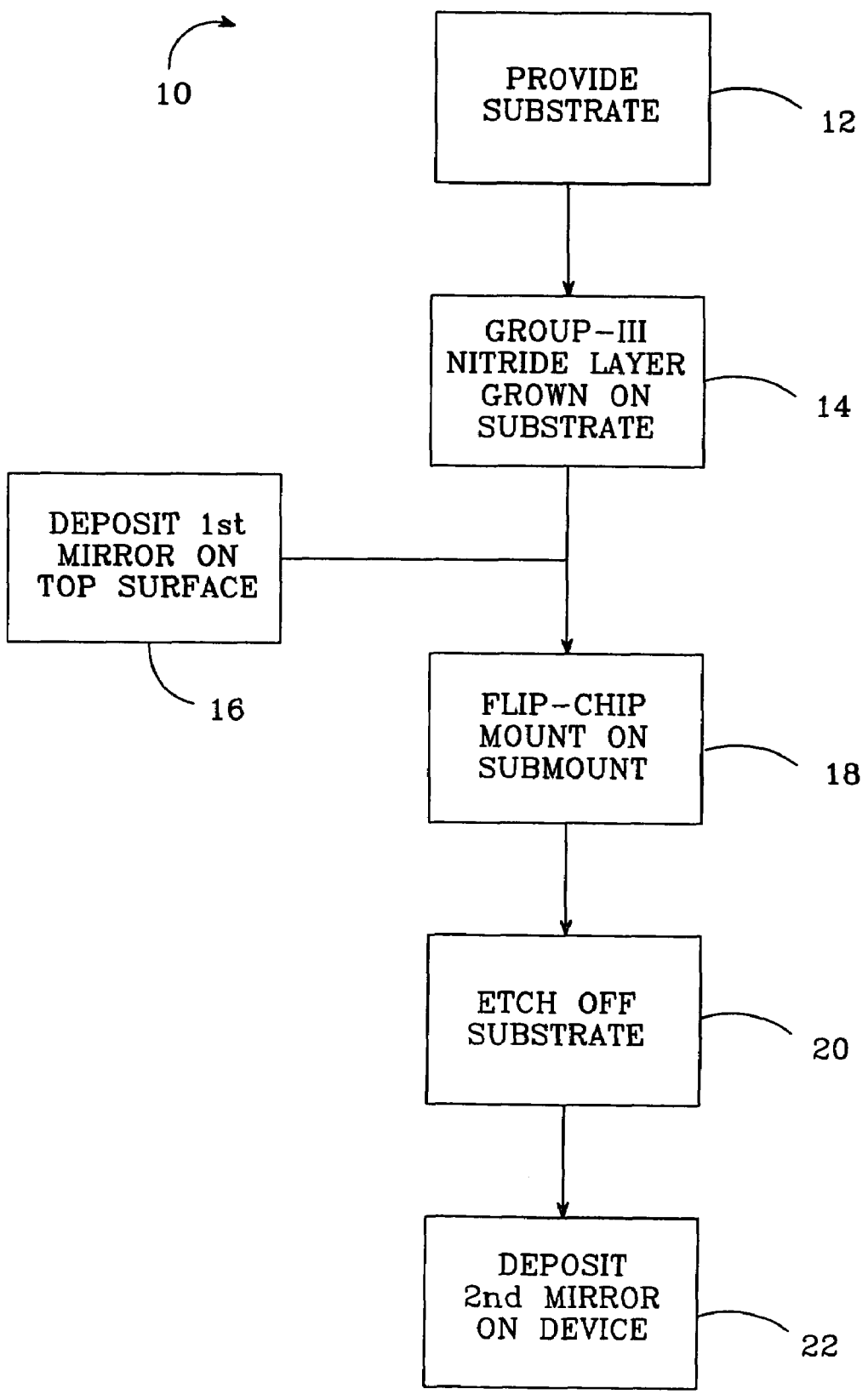
FIG. 1 is a flow diagram for one embodiment of a fabrication method according to the present invention.

FIG. 1 shows one embodiment of a method 10 according to the present invention for fabricating Group-III nitride semiconductors, with the method 10 being particularly adapted for fabricating thin film Group-III nitride semiconductor devices. In step 12, a substrate is provided that can be made of many different materials, with a preferred material being silicon carbide. SiC is a suitable material for use with Group-III nitride materials, such as GaN, because it has a closer crystal lattice match to Group III nitrides GaN, which generally results in Group III nitride films of high quality. Silicon carbide also has high thermal conductivity so that the total output power of Group III nitride devices on silicon carbide is not limited by the thermal dissipation of the substrate (as is the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

In step 14 Group-III nitride epitaxial layer(s) are grown on the substrate using any of the known semiconductor fabrication processes such as molecular beam epitaxy (MBE) or metal organic chemical vapor deposition (MOCVD). Depending on the type of device being fabricated, an optional step 16 is included that comprises depositing a first mirror layer on the surface of the epitaxial layers opposite the substrate. As will be understood by the discussion below, if a light emitting diode (LED) is being fabricated, this mirror helps increase the useful light extraction of the LED, and if an RCLED is being fabricated this mirror is necessary to generate the resonant cavity effect. Different mirrors can be used, such as metal mirrors made of materials such as silver, gold, rhodium, platinum, palladium, gold tin or combinations thereof, which can be deposited on the surface using a conventional method such as sputtering. Alternatively, the mirror can be a distributed Bragg reflector (DBR) which generally comprises multiple pairs of two materials having different refractive indexes. As a result of the difference in the refractive index, Fresnel reflection occurs at each of the interfaces. The reflection at each may not be total, but because of the number of interfaces and the thicknesses of the different layers, the reflected waves constructively interfere so that the DBR provides good reflectivity. Depending on the type of material used for the DBR, it can be deposited on the top surface using the same method used to fabricate the epitaxial layer, usually MBE or MOCVD.

In step 18, the substrate, with its epitaxial layers and first mirror layer, is flip-chip mounted to a submount such that the top surface of the epitaxial layers, or the mirror, as the case may be, is adjacent to the submount. The surface of the epitaxial layer or mirror layer can be bonded to the substrate using many known materials, one example being silver tin eutectic. The submount can be one of a single construction or can include a number of different structural members, and can be made of different materials such as silicon, silicon carbide, sapphire, glass or metals. The submount can also include electronic components to drive the device that comprises the Group-III epitaxial layers.

In step 20, the substrate is etched off of the epitaxial layers with the preferred etch being a composition that selectively removes the substrate at a high etch rate while etching the epitaxial layers at a very low etch rate. In one embodiment according to the present invention, the etch material can be nitrogen tri fluoride, which etches silicon carbide at a rate many times faster than it etches Group-III nitride epitaxial layers. Ions of nitrogen tri fluoride readily remove silicon carbide down to its interface with the Group-III nitride materials. Once the silicon carbide is removed, etching essentially stops because the etch rate of the epitaxial layers is so slow.

Depending on the device being fabricated, alternate step 22 can be included wherein a mirror can be deposited on the surface of the epitaxial layers that is revealed by the etching process. This step is usually included when fabricating a RCLED, solid state laser, or vertical-cavity surface-emitting laser (VCSEL).

The method 10 can be used in fabricating many different semiconductor devices having epitaxial layers made of many different materials with many different thicknesses. The method 10 is particularly adapted to growing high quality thin film Group-III nitride layers used in RCLEDs, which have mirrors on the opposing sides of the thin films. When forming a Group-III nitride RCLED t is impractical to provide a mirror on the interface between the SiC substrate epitaxial layer because mirrors either have no recognizable monocrystalline structure or they are monocrystalline with a significantly different sized crystal lattice than that formed by epitaxial layers. As a result, it is difficult to fabricate high quality thin Group-III nitride layers on a mirror surface because of the mismatch in crystal structures.

SiC substrates, on the other hand, have a good crystal lattice match to Group III nitrides which generally results in thin Group III nitride layers of high quality. The thin epitaxial layers can require support during processing steps that follow growth on the substrate, and the method 10 allows for the first mirror to be deposited on the one surface of the epitaxial layers while the substrate is in place and supports the thin layers. The device is then flip chipped on a submount with the first mirror between the submount and layers. The submount provides additional support while the substrate is etched off and the second mirror is deposited. By providing this support through processing, high quality thin film devices can be fabricated in the Group-III nitride material system.

Figure 2:
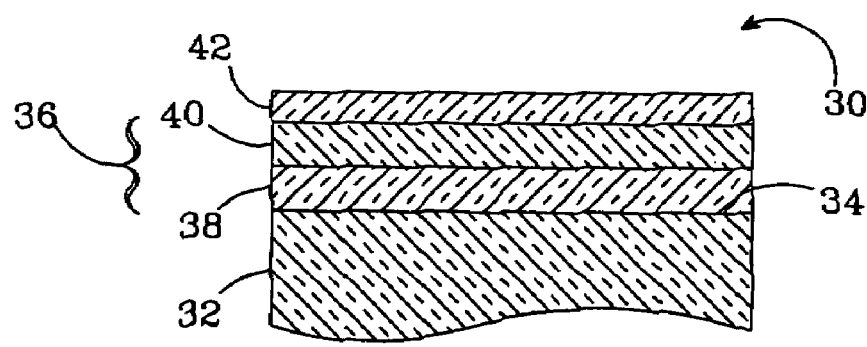
FIG. 2 is a sectional view of one embodiment of a semiconductor device according to the present invention at one of the intermediate steps of the method in FIG. 1.

FIG. 2 shows one embodiment of a RCLED 30 according to the present invention that is fabricated using the method 10, with the RCLED 30 shown at one of the intermediate steps in the method 10. The RCLED 30 comprises a silicon carbide substrate 32 that is used to anchor the epitaxial growth and has a first substrate surface 34 upon which the epitaxial growth nucleates. The first substrate surface 34 then becomes the interface between silicon carbide substrate 32 and epitaxial device structure 36. In this embodiment epitaxial structure 36 comprises an n-type GaN layer 38 that is grown directly on silicon carbide substrate 32 and a p-type GaN layer 40 that is grown on top of n-type layer 38. In other embodiments, an active region can be included between the n-type and p-type layers. The RCLED 30 further comprises a first mirror 42 that is deposited on the exposed surface of p-type epitaxial layer 40. The RCLED 10 is shown as it could appear after step 16 in method 10 of FIG. 1.

Figure 3:
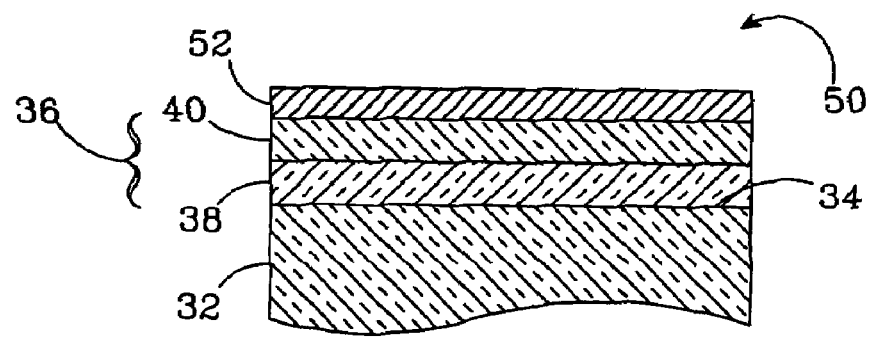
FIG. 3 is a sectional view of another embodiment of a semiconductor device according to the present invention at one of the intermediate steps of the method in FIG. 1.

FIGS. 3-7 show different embodiments of a RCLED according to the present invention as it could appear after step 16 in method 10, with different mirror structures. FIG. 3 shows an RCLED 50, which has many of the same layers and the RCLED 30. For those layers that are the same in this figure (and the figures that follow) the same reference numerals will be used and the features will not be reintroduced. In RCLED 50 the first mirror 52 comprises a p-type metal mirror that can be made of silver, gold, rhodium, platinum, palladium or gold tin or combinations thereof.

Figure 4:
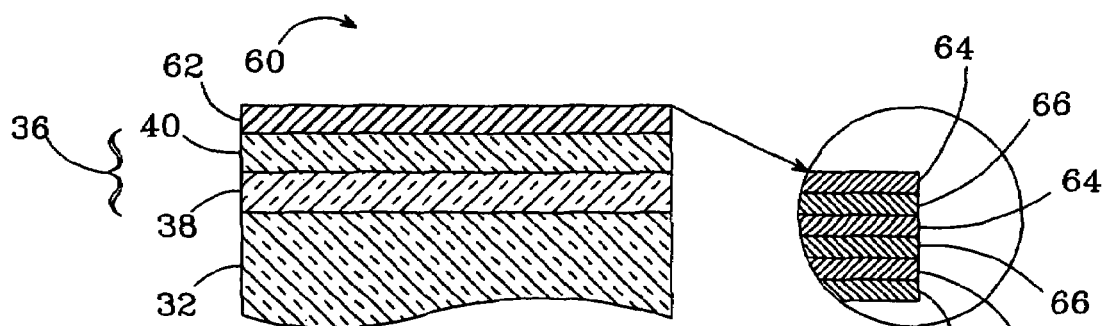
FIG. 4 is a sectional view of another embodiment of a semiconductor device according to the present invention at one of the intermediate steps of the method in FIG. 1.

FIG. 4 shows another embodiment of a RCLED 60 also having many of the same layers as RCLED 30, but wherein the first mirror 62 is a DBR as described above in method 10. DBR first mirror 62 can be made of many different layer pairs having different thicknesses and different indexes of refraction, with the DBR first mirror 62 preferably made of alternating dielectric layers of quarter wavelength thicknesses p-type silicon dioxide 64 and p-type titanium oxide 66. Another embodiment of the DBR first mirror 62 according to the present invention comprises alternating dielectric layers of silicon dioxide and tantalum pentoxide. The contrast in indexes of refraction between device structure 36 made of GaN and layers 64, 66 that form DBR first mirror 62 is sufficient that the DBR first mirror 62 effectively reflects light with two to four alternating layer pairs, with a suitable number of alternating layer pairs being three, although a DBR first mirror 62 with fewer or more pairs can also be used. The thickness of these layers corresponds to a quarter wavelength of light generated by the epitaxial device structure 36 when a bias is applied across the n-type and p-type layers 38, 40.

Figure 5:
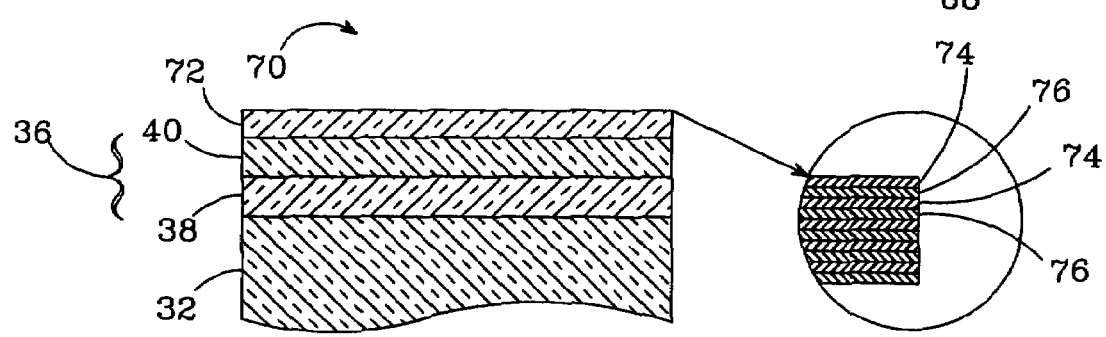
FIG. 5 is a sectional view of another embodiment of a semiconductor device according to the present invention at one of the intermediate steps of the method in FIG. 1.

FIG. 5 shows another embodiment of an RCLED 70 having a first mirror 72 that is also a DBR made of p-type alternating pairs, with the alternating pairs made of an epitaxial material. Many different alternating pairs can be used, with the DBR first mirror 72 comprising alternating pairs of p-type GaN 74 and p-type aluminum nitride 76. In other embodiments of the DBR first mirror 72 aluminum alloy nitride can be used instead of aluminum nitride. The index of refraction difference between epitaxial device structure 36 and the material that comprises DBR first mirror 72 is such that the mirror 72 requires approximately eight to twelve layer pairs that are approximately a quarter wavelength thick, with a suitable number of layer pairs being ten. It is understood that the DBR will also work with fewer and more layer pairs.

One concern when fabricating Group-III nitride LEDs is ensuring that current spreads from the contacts throughout the n-type and p-type layers such that the LED uniformly emits light. N-type Group-III nitride material is a good conductor, so current typically spreads from its contact throughout the layer. P-type Group-III nitride material, conversely, is not a good conductor and current has difficulty spreading from a contact, particularly for larger devices. The metal mirror 52 in FIG. 3 is a good conductor and will spread current from a contact throughout the p-type layer. The p-type DBR mirrors 62, 72 described above in FIGS. 4 and 5, however, do not effectively conduct electricity and have difficulty spreading current from a contact throughout the p-type layer.

Figure 6:
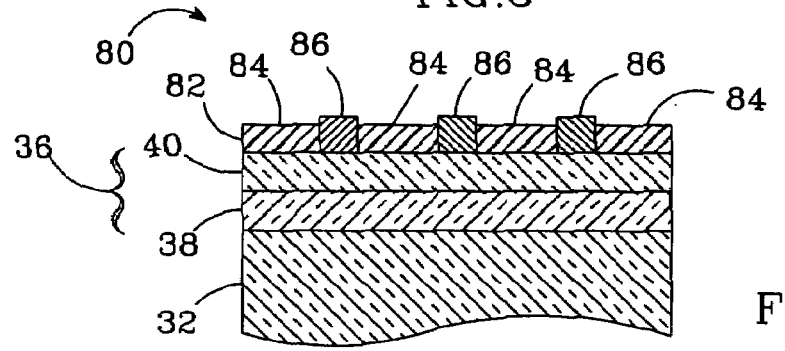
FIG. 6 is a sectional view of still another embodiment of a semiconductor device according to the present invention at one of the intermediate steps of the method in FIG. 1.
Figure 7:
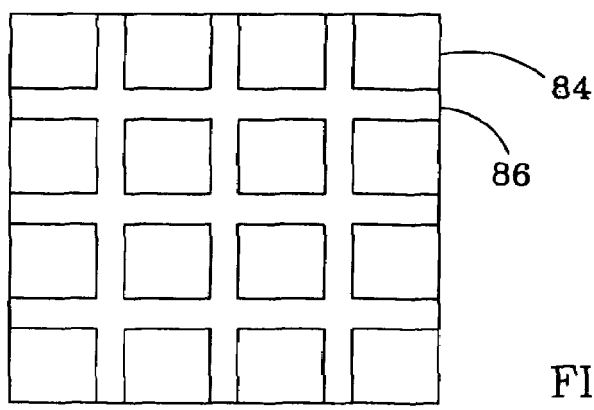
FIG. 7 is a plan view of the semiconductor device in FIG. 6.

FIG. 6 shows a RCLED 80 that combines the DBR p-type first mirror 82 with a metal mirror to enhance current spreading into the p-type layer 40, with the first mirror 82 comprising a DBR 84 with a metal mesh 86 to spread current from a contact. The DBR 84 is deposited on epitaxial structure 36 with a sufficient number of layers of appropriate thickness to be highly reflective. Channels are then opened in DBR 84, usually by etching, which extend across the surface of the p-type layer 40 and are interconnected. These channels are then filled with metal mirror material to form the metal mesh 86. DBR 84 has a higher reflectivity of metal 86, but the combination of metal 86 and DBR 84 comprises a layer with sufficient reflectivity and good current spreading. FIG. 7 is a top plan view of RCLED 80 showing the top surface of the DBR 84 and metal mesh 86. The metal mesh is shown as orthogonal and interconnected channels, although the mesh can have many different channel arrangements.

Figure 8:
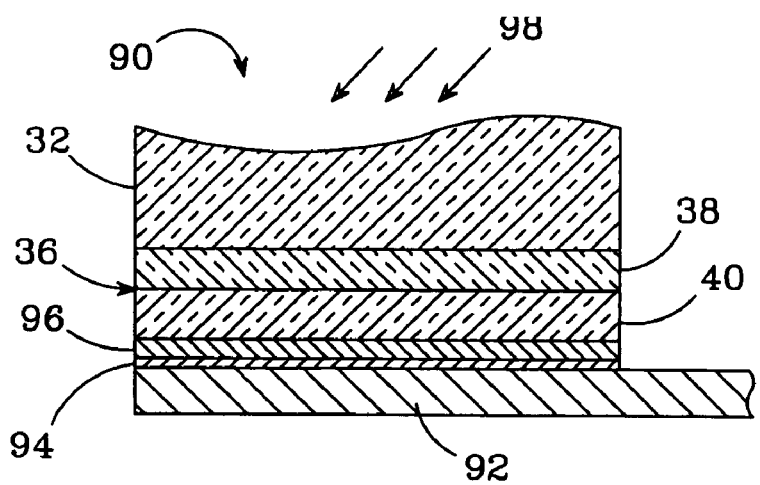
FIG. 8 is a sectional view of one embodiment of a semiconductor device according to the present invention at a flip chip step of the method in FIG. 1.

FIG. 8 shows an RCLED 90 after it is flip chip mounted on a submount pursuant to step 18 in the method 10 of FIG. 1. The RCLED has many of the same features of RCLED 30 in FIG. 2 and, as with the FIGS. 3-7, the same reference numerals are used for the same features. The RCLED 90 can be any one of the RCLEDs described above in relation to FIGS. 2-7 and is flipped and adhered to a submount 92 by a bonding layer/material 94 with the mirror layer 96 adjacent to the submount 92. In one embodiment according to the invention the bonding layer/material 94 comprises a submount epoxy material comprising silver tin eutectic. As described above, submount 92 can be one of many structural members including silicon, silicon carbide, sapphire, glass or metals.

Once the RCLED 90 is bonded to submount 92 the substrate 32 can be removed from the structure 36, preferably by etching. The RCLED 90 with its submount 92 (hereinafter referred to as "RCLED 90") can be placed in a reactive ion etch chamber having a reactive ion etch environment 98 that etches the substrate 32 at a high rate and etches the epitaxial layers at a slow rate. One embodiment of an etch environment according to the present invention comprises ions of nitrogen tri-fluoride, with the ions readily reducing and removing silicon carbide substrate 12 from the RCLED 30 until the surface of the epitaxial device structure 36 is reached, in this case the surface of the n-type epitaxial layer. Because the etch rate for silicon carbide is significantly greater than the etch rate of GaN, once all of silicon carbide substrate 12 has been removed, etching essentially ceases.

Figure 9:
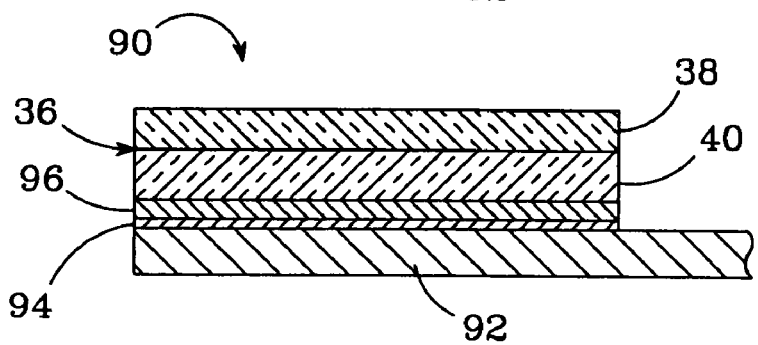
FIG. 9 is sectional view of the semiconductor device in FIG. 8 after etching off the substrate according to the method of FIG. 1.

FIG. 9 shows the RCLED 90 of FIG. 8 with the substrate removed by the reactive ion etch after step 20 in the method 10 of FIG. 1. The reactive ion etch in one embodiment can leave the top surface of semiconductor 30 in a condition ready to receive epitaxial growth or deposition of a metal for a second mirror.

Figure 10:
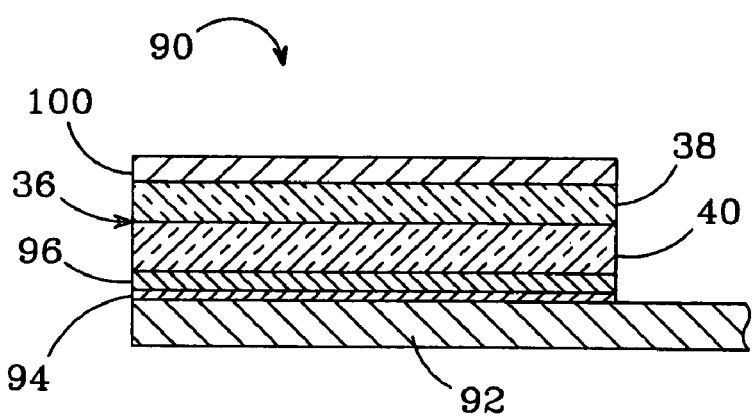
FIG. 10 is a sectional view of one embodiment of a semiconductor device according to the present invention at another intermediate step of the method in FIG. 1.
Figure 11:
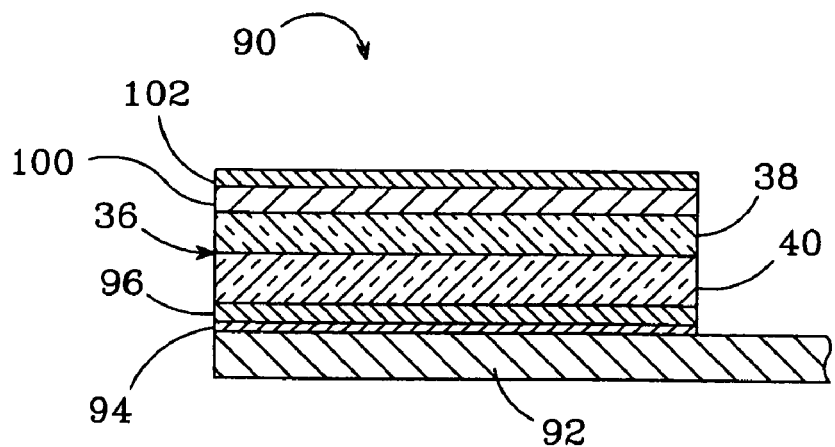
FIG. 11 is a sectional view of another embodiment of a semiconductor device according to the present invention at another step of the method in FIG. 1.

FIG. 10-15 show different embodiments of an RCLED according to the present invention after step 22 of the method 10 in FIG. 1, with the different RCLEDs comprising different types of second mirrors. FIG. 10 shows one embodiment on the RCDLED 90 of FIG. 9 with a second mirror layer 100 on the newly exposed surface of the n-type layer 38. The second mirror layer 100 can be many different mirror types such as an n-type metal mirror, an n-type DBR or an n-type epitaxial Bragg reflector. The second mirror layer 100, however, should have a lower reflectivity than the first mirror so that light exits the RCLED through the second mirror layer 100. The first mirror layer 96 can also be any of a metal layer, a p-type Bragg reflector DBR, or a p-type epitaxial mirror. Metallization layer 102 cab be deposited on the exposed surface of second mirror n-type layer 100 and can be any of gold, silver, rhodium, palladium, platinum or gold tin for bonding.

Figure 12:
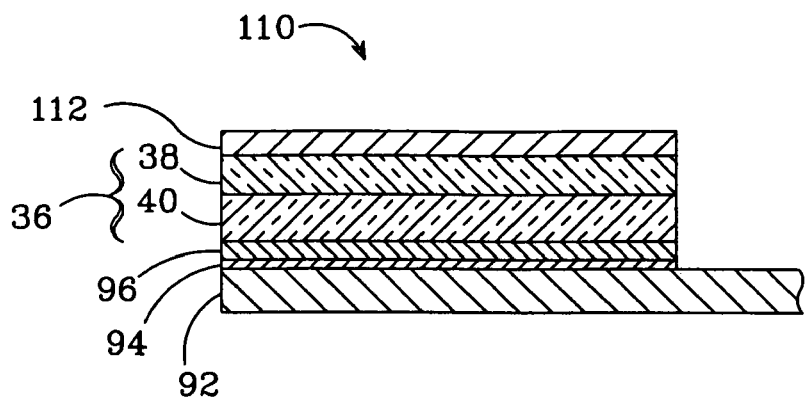
FIG. 12 is a sectional view of another embodiment of a semiconductor device according to the present invention at another step of the method in FIG. 1.
Figure 13:
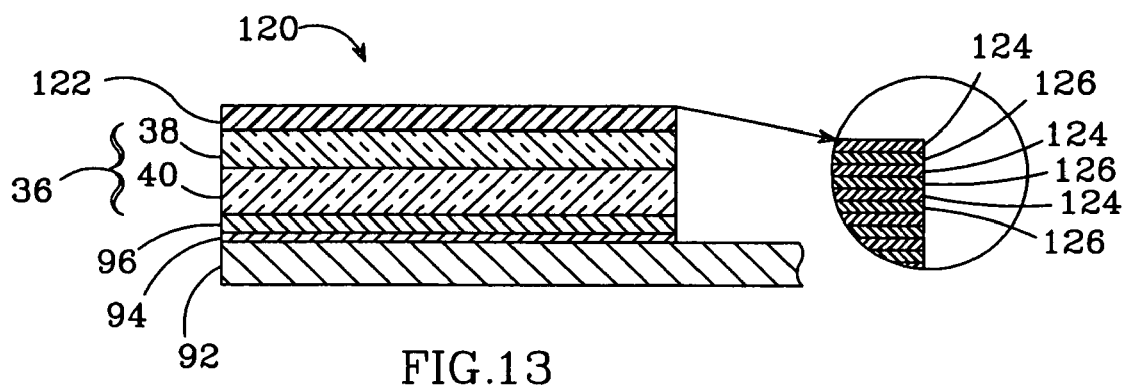
FIG. 13 is a sectional view of another embodiment of a semiconductor device according to the present invention at another step of the method in FIG. 1.
Figure 14:
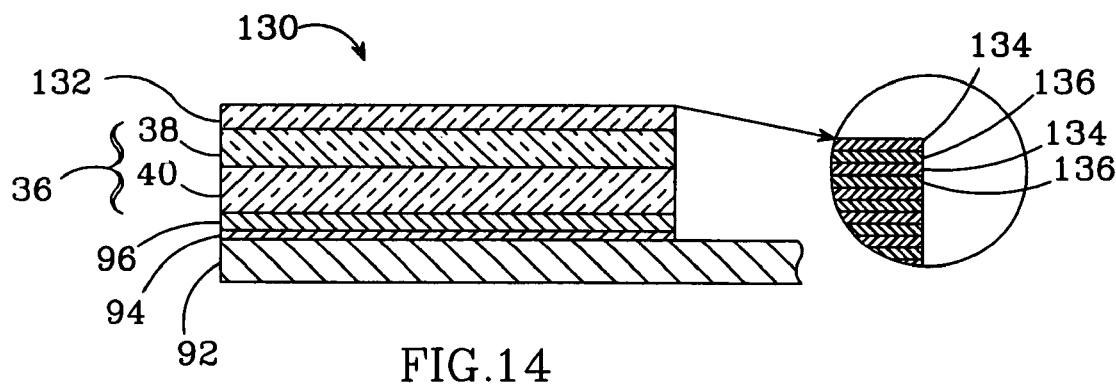
FIG. 14 is a sectional view of another embodiment of a semiconductor device according to the present invention at another step of the method in FIG. 1.

FIGS. 12-15 show embodiments of a RCLED according to the present invention, each of which uses a different type of second mirror layer. FIG. 12 shows a RCLED 110 according to the present invention utilizing an n-type metal for its second mirror layer 112 that can be made of the same material as mirror layer 52 described above and shown in FIG. 3. FIG. 13 shows a RCLED 120 according to the present invention utilizing an n-type DBR as its second mirror layer 122. The DBR mirror layer is similar to the p-type DBR first mirror 62 shown in FIG. 4 and can be made of many different alternating pairs, but is preferably made of approximately three alternating pairs of a silicon dioxide layer 124 and a titanium dioxide 126. FIG. 14 shows a RCLED 130 according to the present invention also utilizing a DBR as its second mirror layer 132 that is similar to the DBR first mirror layer 72 in FIG. 5 and comprises approximately ten pairs of n-type GaN 134 and n-type aluminum nitride 136.

Figure 15:
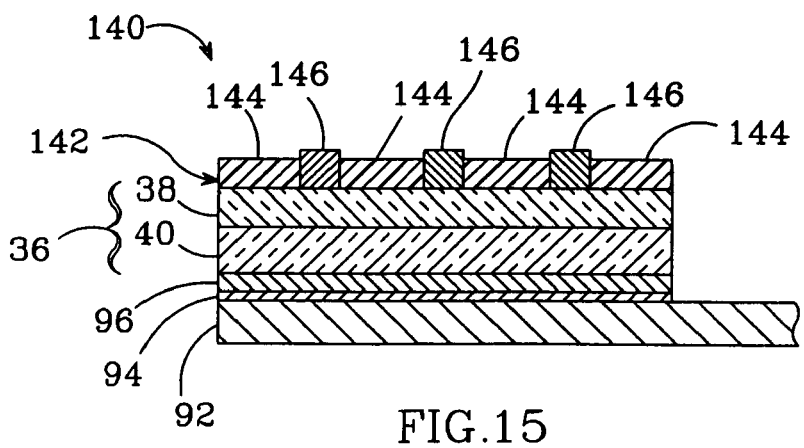
FIG. 15 is a sectional view of another embodiment of a semiconductor device according to the present invention at another step of the method in FIG. 1.
Figure 16:
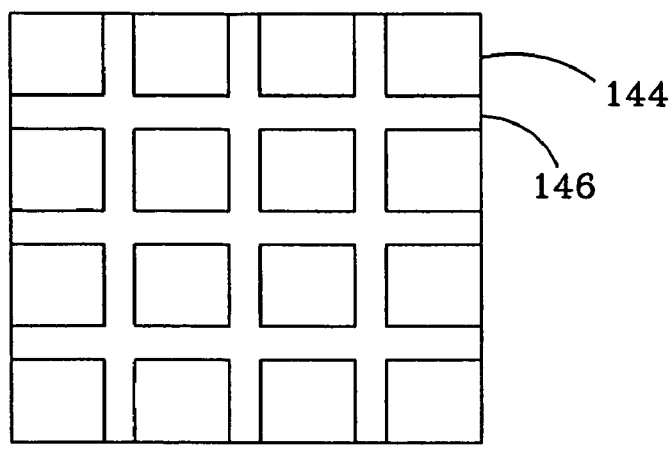
FIG. 16 is a plan view of the semiconductor device in FIG. 15.

Although current spreading is not so much of a concern for n-type Group-III nitride materials, current spreading structure can also be included in the second mirror layer. FIGS. 15 and 16 show an embodiment of an RCLED 140 according to the present invention wherein the second mirror layer 142 comprises an n-type DBR 144 with a metal mesh 146 that is similar to the DBR 84 and metal mesh 146 described above and shown in FIGS. 6 and 7, with the metal mesh 86 providing for good current spreading throughout the n-type epitaxial layer 38.

FIGS. 17-20 show different embodiments of an RCLED according to the present invention that can be fabricated using the method 10 in FIG. 1. In each of the RCLEDs shown, the first mirror layer can be any of the metal mirror deposition, the p-type DBR, or the p-type epitaxial DBR. Similarly, in each of the RCLEDs the second mirror layer can be an n-type metal mirror, n-type DBR, or n-type epitaxial DBR. In these figures the selection of the second mirror layer is not constrained by the selection of the first mirror layer and vice versa. For example, second mirror layer can be an n-type metal mirror when first mirror layer is a p-type DBR.

Figure 17:
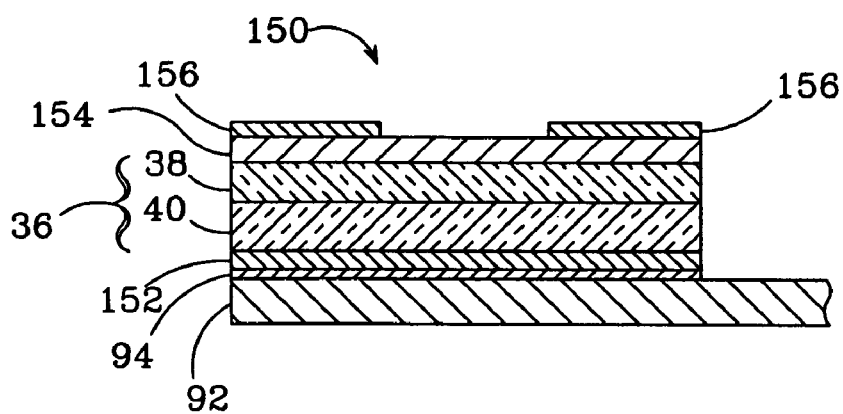
FIG. 17 is a sectional view of one embodiment of a semiconductor device according to the present invention.

FIG. 17 shows one embodiment of an RCLED 150 according to the present invention that can be fabricated using the method 10 in FIG. 1. As described above, RCLEDs require that the epitaxial structure 36 be thin, having a thickness of approximately one wavelength of the light being emitted by the structure 36. The method 10 provides for the fabrication of high quality Group-III nitride thin layers particularly adapted to RCLEDs. The first and second mirror layers 152, 154 can be any of those described above and the RCLED 150 also comprises a contact metal layer 156 on the second mirror layer 154. The p-type layer 40 can be contacted through the submount 92 such that the RCLED 150 emits light in response to a bias applied across the submount 92 and the contact metal layer 156.

Figure 18:
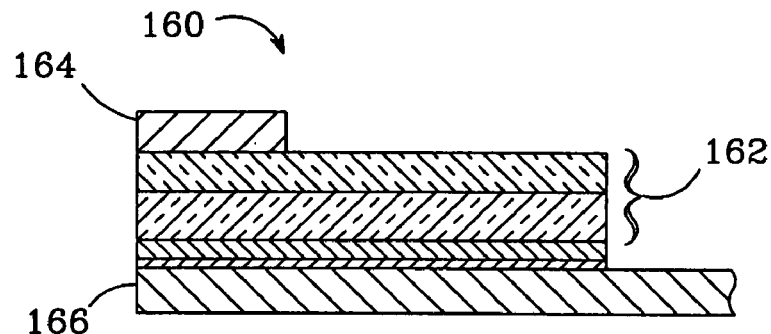
FIG. 18 is a sectional view of another embodiment of a semiconductor device according to the present invention.

The method 10 in FIG. 1 can also be used in the fabrication of devices having epitaxial layers that are thicker than those in RCLEDS. FIG. 18 shows one embodiment of a standard LED 160 according to the present invention, fabricated by the method 10. The epitaxial structure 162 has dimensions significantly larger than those of epitaxial structure 36 in the RCLEDs above, but the method 10 is equally adapted to the fabrication of devices with thicker layers. The LED 160 also has an n-type contact 164 to provide a current to one of the oppositely doped layers in the structure 162, with the other of the oppositely doped layers contacted through the submount 166.

Figure 19:
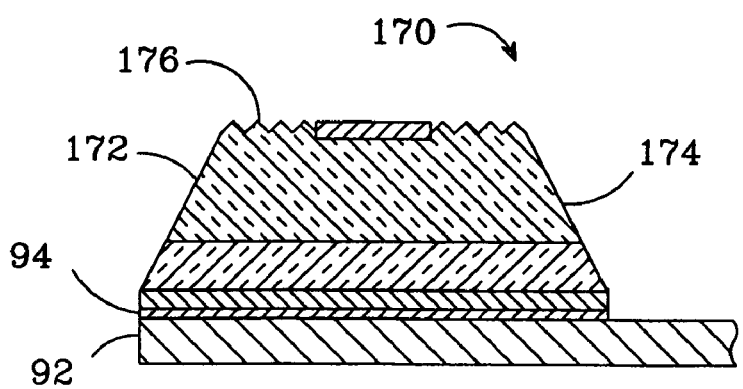
FIG. 19 is a sectional view of another embodiment of a semiconductor device according to the present invention.

The method 10 can also be used in fabricating epitaxial devices that have other features to enhance light extraction. FIG. 19 shows an embodiment of LED 170 that has shaped side surfaces 172, 174 and is roughened on its primary emitting surface 176. The LED 170 is typically shaped and roughened after the substrate removal method 10 is complete. Shaping and roughening the LED 170 increases the light extraction of the LED 170 by increasing the fraction of light that hits the surface and escapes to emit light from the device.

Figure 20:
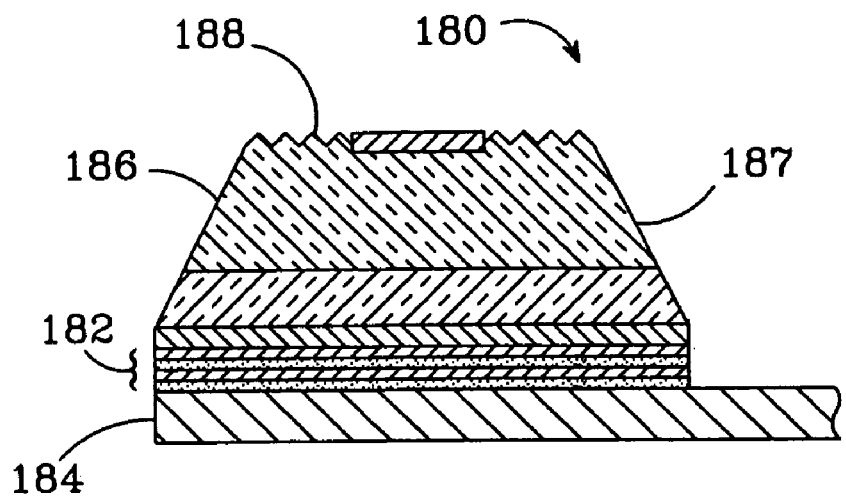
FIG. 20 is a sectional view of another embodiment of a semiconductor device according to the present invention.

All of the devices described herein can also be fabricated with additional layers and features, one of them being a structure to protect the device from electrostatic discharge (ESD). FIG. 20 shows an LED 180 that is similar to the LED 170 of FIG. 19, but includes a zener diode 182 arranged between the submount 184 and the first mirror layer 186. The zener diode 182 is integrated into the submount 184 during submount fabrication and constrains the flow of current through the LED to one direction only. The LED shown also has angled side surfaces 186, 187 and a roughened emitting surface 188. When fabricating LED 180 using the method 10, the submount 184 is provided with the zener diode structure 182, such that when the device is flip-chip mounted on the submount 184 the zener diode structure 182 is integral with the device. The resulting structure provides high light extraction efficiency and high ESD rating. It is understood that the zener diode structure can be included in many different devices according to the present invention, including the different embodiments of the RCLEDs described above as well as vertical cavity surface emitting lasers and laser diodes.

Figure 21:
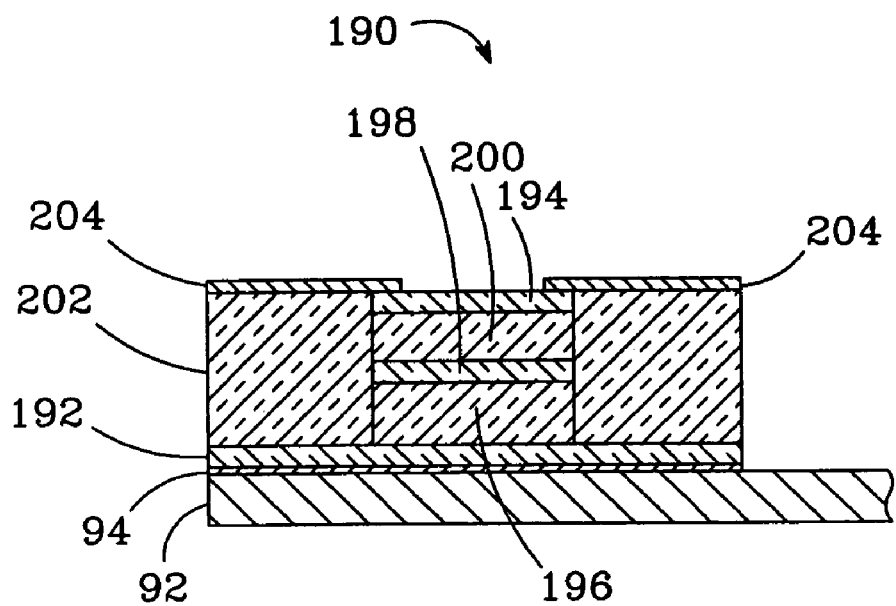
FIG. 21 is a sectional view of still another embodiment of a semiconductor device according to the present invention.

The method 10 can also be used to fabricate other devises such as a vertical cavity surface emitting laser (VCSEL). FIG. 21 shows one embodiment of a VCSEL 190 according to the present invention fabricated by the method 10. In this embodiment the first and second mirror layers surfaces 192, 194 are DBR mirrors. First DBR mirror 192 is shown adhered to submount 92 by an epoxy epoxy/metallization 94. The quantum well structure of this embodiment is a single quantum well having a lower cladding layer 196 that can be fabricated from aluminum indium gallium nitride. Quantum well 198 is arranged above lower cladding layer 196, and the quantum well 198 can be fabricated in one example from indium gallium nitride. Upper cladding layer 200 is arranged above the quantum well 198, such that the quantum well is sandwiched between the upper and lower cladding layers 200, 196. Upper cladding layer 200 can be fabricated from aluminum gallium nitride.

The second DBR mirror layer 194 is deposited on top of upper cladding layer 200. This structure may be etched away to form isolated columns that can be round or rectangular. These isolated columns may then be further isolated by isolation epitaxial growth 202. In one embodiment the isolation material may be ion implanted. Implantation may damage the crystalline structure between the cells which would require annealing. The device is capped off with metallization 204. Metallization uses isolation structures for support but since the isolation structure does not conduct electricity the metallizations must at least partially contact mirror 194.

Although the present invention has been described in considerable detail with reference to certain preferred configurations thereof, other versions are possible. The methods according to the present invention can be used to fabricate many different devices and the devices described above can have many different layer arrangements. Therefore, the spirit and scope of the appended claims should not be limited to the preferred versions in the specification.

We claim:

1. A method for fabricating high light extraction photonic devices, comprising:
   growing a Group-III nitride epitaxial semiconductor device structure on a silicon carbide (SiC) substrate, said epitaxial semiconductor structure and substrate comprising an emitter adapted to emit light in response to a bias;
   flip-chip mounting said emitter on a submount such that said epitaxial semiconductor device structure is sandwiched between said submount and said substrate, and
   etching said substrate off said epitaxial semiconductor device by utilizing an etch environment that etches said substrate substantially faster than said epitaxial semiconductor structure.

2. The method of claim 1, wherein said substrate comprises a monocrystalline material.

3. The method of claim 1, wherein said substrate comprises monocrystalline silicon carbide (SiC).

4. The method of claim 1, wherein said etch environment comprises a reactive ion etch.

5. The method of claim 1, wherein said etch environment comprises nitrogen trifluoride ($NF_3$).

6. The method of claim 1, further comprising depositing a first mirror layer on said epitaxial semiconductor structure opposite said substrate structure prior to said flip-chip mounting of said emitter, said mirror sandwiched between said epitaxial semiconductor structure and said submount after said flip-chip mounting.

7. The method of claim 6, wherein said first mirror layer comprises a reflective metal.

8. The method of claim 6, wherein said first mirror layer comprises a distributed Bragg reflector (DBR) comprising a plurality of alternating layer pairs of dielectric material.

9. The method of claim 8, wherein each of said layer pairs comprise a layer of silicon dioxide ($SiO_2$) and a layer of titanium dioxide ($TiO_2$), or a layer of silicon dioxide ($SiO_2$) and a layer of tantalum pentoxide ($Ta_2O_5$), said pairs of layers having a thickness approximately equal to a quarter of said wavelength of said emitted light.

10. The method of claim 8, wherein said layer pairs repeat two to four times.

11. The method of claim 6, wherein said first mirror layer comprises an epitaxial DBR comprising a plurality of alternating layer pairs of epitaxial material.

12. The method of claim 11, wherein each of said alternating layer pairs comprises a layer of gallium nitride (GaN) and a layer of aluminum nitride (AlN), or a layer of gallium nitride (GaN) and a layer of an alloy of aluminum nitride ($Al_zX_yN$), said alternating layer pairs having a thickness approximately equal to a quarter of said wavelength of said emitted light.

13. The method of claim 11, wherein said pairs of layers repeats eight to twelve times.

14. The method of claim 1, wherein said submount comprises one of the materials from the group consisting of silicon carbide (SiC), silicon, sapphire, metal and glass.

15. The method of claim 1, further comprising depositing a second mirror layer on said epitaxial semiconductor structure after said substrate has been etched, said second mirror layer arranged such that said epitaxial semiconductor structure is sandwiched between said submount and said second mirror layer.

16. The method of claim 15, wherein said second mirror layer comprises a reflective metal.

17. The method of claim 15, wherein said second mirror layer comprises a distributed Bragg reflector (DBR) comprising a plurality of alternating layer pairs of dielectric material.

18. The method of claim 17, wherein each of said layer pairs comprise a layer of silicon dioxide ($SiO_2$) and a layer of titanium dioxide ($TiO_2$), or a layer of silicon dioxide ($SiO_2$) and a layer of tantalum pentoxide ($Ta_2O_5$), the thickness of said layer pairs equal to approximately a quarter of said wavelength of said emitted light.

19. The method of claim 17, wherein said layer pairs repeat two to four times.

20. The method of claim 15, wherein said second mirror layer comprises an epitaxial DBR comprising a plurality of alternating layer pairs of epitaxial material.

21. The method of claim 20, wherein each of said alternating layer pairs comprises a layer of gallium nitride (GaN) and a layer of aluminum nitride (AlN), or a layer of gallium nitride (GaN) and a layer of an alloy of aluminum nitride ($Al_zX_yN$), said alternating layer pairs having a thickness approximately equal to a quarter of said wavelength of said emitted light.

22. The method of claim 20, wherein said pairs of layers repeats eight to twelve times.

23. The method of claim 1, wherein growing an epitaxial semiconducting structure comprises:
growing a first epitaxial semiconductor layer on said substrate, and
growing a second epitaxial semiconductor layer on said first epitaxial semiconductor layer, such that said first semiconductor layer is sandwiched between said substrate and said second semiconductor layer.

24. The method of claim 23, wherein growing an epitaxial semiconducting structure comprises growing thin doped layers and forming a resonant cavity light emitting diode.

25. A method for fabricating high light extraction photonic devices, comprising:
growing an epitaxial semiconductor structure on a silicon carbide substrate;
depositing a first mirror layer on said epitaxial semiconductor structure such that said epitaxial semiconductor structure is sandwiched between said first mirror layer and said substrate;
removing said substrate from said epitaxial structure by introducing an etch environment to said substrate; and
depositing a second mirror layer on said epitaxial semiconductor structure such that said epitaxial semiconductor structure is sandwiched between said first and second mirror layers.

26. The method of claim 25, wherein said etch environment etches said substrate substantially faster than said epitaxial semiconducting structure, etching off substantially all of said substrate without etching off substantially any of said epitaxial semiconducting structure.

27. The method of claim 25, wherein said epitaxial semiconductor structure is adapted to emit light in response to an electrical signal.

28. The method of claim 25, wherein said epitaxial semiconductor structure comprises a Group-III nitride semiconductor material.

29. The method of claim 25, wherein said substrate comprises monocrystalline silicon carbide (SiC).

30. The method of claim 25, wherein said etch environment comprises a reactive ion etch.

31. The method of claim 25, wherein said etch environment comprises nitrogen trifluoride ($NF_3$).

32. The method of claim 25, wherein either of said first or second mirror layers comprise a reflective metal.

33. The method of claim 25, wherein said either first or second mirror layer comprise distributed Bragg reflector (DBR) mirror having alternating layer pairs of dielectric material.

34. The method of claim 33, wherein each of said layer pairs comprise a layer of silicon dioxide ($SiO_2$) and a layer of titanium dioxide ($TiO_2$), or a layer of silicon dioxide ($SiO_2$) and a layer of tantalum pentoxide ($Ta_2O_5$).

35. The method of claim 25, wherein either of said first or second mirror layers comprise an epitaxial DBR mirror alternating layer pairs of epitaxial material.

36. The method of claim 35, wherein each of said alternating layer pairs comprises a layer of gallium nitride (GaN) and a layer of aluminum nitride (AlN), or a layer of gallium nitride (GaN) and a layer of an alloy of aluminum nitride ($Al_zX_yN$).

37. The method of claim 25, further comprising flip-chip mounting said first mirror layer, epitaxial semiconductor structure and substrate combination on a submount after depositing said first mirror, such that said first mirror layer is adjacent to said submount and said first mirror layer and epitaxial semiconductor structure is sandwiched between said submount and substrate.

38. The method of claim 37, wherein said submount comprises one of the group consisting of monocrystalline silicon carbide (SiC), a silicon substrate and glass.

39. A resonant cavity light emitting diode (RCLED), comprising:
a thin film epitaxial semiconductor structure;
a first mirror layer on one surface of said epitaxial semiconductor structure;
a second mirror layer on another surface of said epitaxial semiconductor structure such that said epitaxial semiconductor structure is sandwiched between said first and second mirrors, said second mirror layer being less reflective than said first mirror layer;
a submount, said epitaxial semiconductor structure with its said first and second mirrors mounted on said submount, said first mirror layer being adjacent to said submount and said second mirror layer being the primary emitting surface.

40. The RCLED of claim 39, wherein said epitaxial semiconductor device emits light and has a thickness to provide a resonant cavity for said light.

41. The RCLED of claim 39, wherein said epitaxial semiconductor device comprises two layers of semiconductor material that are oppositely doped.

42. The RCLED of claim 39, wherein said epitaxial semiconductor device comprises a semiconductor active region sandwiched between two oppositely doped layers.

43. The RCLED of claim 39, wherein said either said first or second mirror layer comprise a metal.

44. The RCLED of claim 39, wherein said first or second mirror layers comprise a distributed Bragg reflector (DBR).

45. A method for removing a silicon carbide substrate from a Group-III nitride epitaxial semiconductor material, comprising:
   growing a Group-III nitride epitaxial semiconductor material on a silicon carbide substrate;
   introducing an etch environment to said silicon carbide substrate, said etch environment etching silicon carbide faster than said Group-III nitride epitaxial material such that said etching substantially stops after said silicon carbide is etched off.

46. The method of claim 45, wherein said etch environment comprises a reactive ion etch.

47. The method of claim 45, wherein said etch environment comprises nitrogen trifluoride ($NF_3$) reactive ion etch.

* * * * *